(12) United States Patent
Jain et al.

(10) Patent No.: US 11,683,029 B1
(45) Date of Patent: Jun. 20, 2023

(54) CHARGE INJECTION PROTECTION DEVICES AND METHODS FOR INPUT/OUTPUT INTERFACES

(71) Applicant: NXP B.V., Eindhoven (NL)

(72) Inventors: Ashutosh Jain, Pensacola, FL (US); Khoi Mai, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/648,199

(22) Filed: Jan. 18, 2022

(51) Int. Cl.
*H03K 3/00* (2006.01)
*H03K 5/08* (2006.01)
*H03K 19/00* (2006.01)
*G06F 13/38* (2006.01)
*G06F 13/42* (2006.01)
*H03K 17/0812* (2006.01)
*H03K 17/10* (2006.01)

(52) U.S. Cl.
CPC ..... *H03K 17/08122* (2013.01); *H03K 17/102* (2013.01)

(58) Field of Classification Search
None
See application file for complete search history.

(56) References Cited

U.S. PATENT DOCUMENTS

| | | | |
|---|---|---|---|
| 4,812,688 A | * | 3/1989 | Chu .................. H01L 27/092 257/E27.062 |
| 6,392,440 B2 | | 5/2002 | Nebel |
| 8,098,088 B1 | * | 1/2012 | Sutandi ........... H03K 3/356121 327/309 |
| 9,094,008 B2 | * | 7/2015 | Lee ................... H03K 17/6872 |
| 10,210,946 B2 | * | 2/2019 | Samuels ............ H03K 17/102 |
| 2009/0309647 A1 | | 12/2009 | Lim et al. |

FOREIGN PATENT DOCUMENTS

EP 1024596 B1 12/1999

* cited by examiner

Primary Examiner — Kenneth B Wells

(57) ABSTRACT

A transmission gate includes a first P-type transistor and a second P-type transistor coupled in series between a first signal node and an internal node. The transmission gate is enabled by turning on the first P-type transistor and the second P-type transistor to communicate signals between the first signal node and the internal node. The transmission gate is disabled by turning off the first P-type transistor and the second P-type transistor to stop communicating signals between the first signal node and the internal node. While the transmission gate is disabled, a third P-type transistor having a first current electrode coupled to a circuit node between the first and second P-type transistors and a control electrode coupled to the first signal node is used to track voltage of the first signal node and, in response to the tracking, control a voltage level at the circuit node to limit a gate-to-source voltage of the first P-type transistor.

17 Claims, 5 Drawing Sheets

CHARGE INJECTION PROTECTION DEVICES AND METHODS FOR INPUT/OUTPUT INTERFACES

BACKGROUND

Field

This disclosure relates generally to semiconductor devices, and more specifically, to protecting circuitry from charge injection.

Related Art

Integrated circuit devices, such as microcontrollers and microprocessors, often include input/output (I/O) circuitry to interface and communicate with components external to the device. As circuit components continue to decrease in size, it is increasingly common for the I/O interface to support a voltage which is higher than the technology allows. For example, in process nodes below 10 nm, devices with relatively thick gate oxide can only support up to 1.5V while the I/O pads may be required to operate at 1.8V.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments disclosed herein provide a transmission gate structure with overvoltage and charge injection protection circuitry for an IO pad. The protection circuits use a combination of a cascode structure and a mid-node transistor for charge injection protection. When the protection circuitry is not present, nodes can potentially settle to a voltage that brings the gate-source voltage of mid-node transistors beyond their maximum limit. The protection circuitry utilizes additional control signals to enable/disable cascode switches and track the I/O pad voltage to prevent the voltage for the internal nodes from being outside a safe range, thereby protecting the mid-node transistor from damage due to charge injection. In some situations, an I/O interface may support a voltage which is higher than the transmission gates coupled to the I/O interface allow. For example, in process nodes below 10 nm, the transmission gate transistors may only support up to 1.5V while the I/O pads are required to operate at 1.8V. Embodiments of the protection schemes disclosed herein help provide a safe operating region for the transmission gate transistors that operate at less than or equal to 1.5V. Additionally, due to capacitive coupling, the I/O pads may go above 1.8V or below 0V. A cascode transmission gate disclosed herein ensures that under those conditions there is no current path between I/O pads due to charge injection. The protection schemes can be used in systems that implement single-ended or differential signalling for I/O signals. These types of systems or devices can include a multiplexer in an interface to an analog to digital converter, switchable termination resistors for low voltage differential signal driver circuitry, and other suitable devices.

Figure 1:
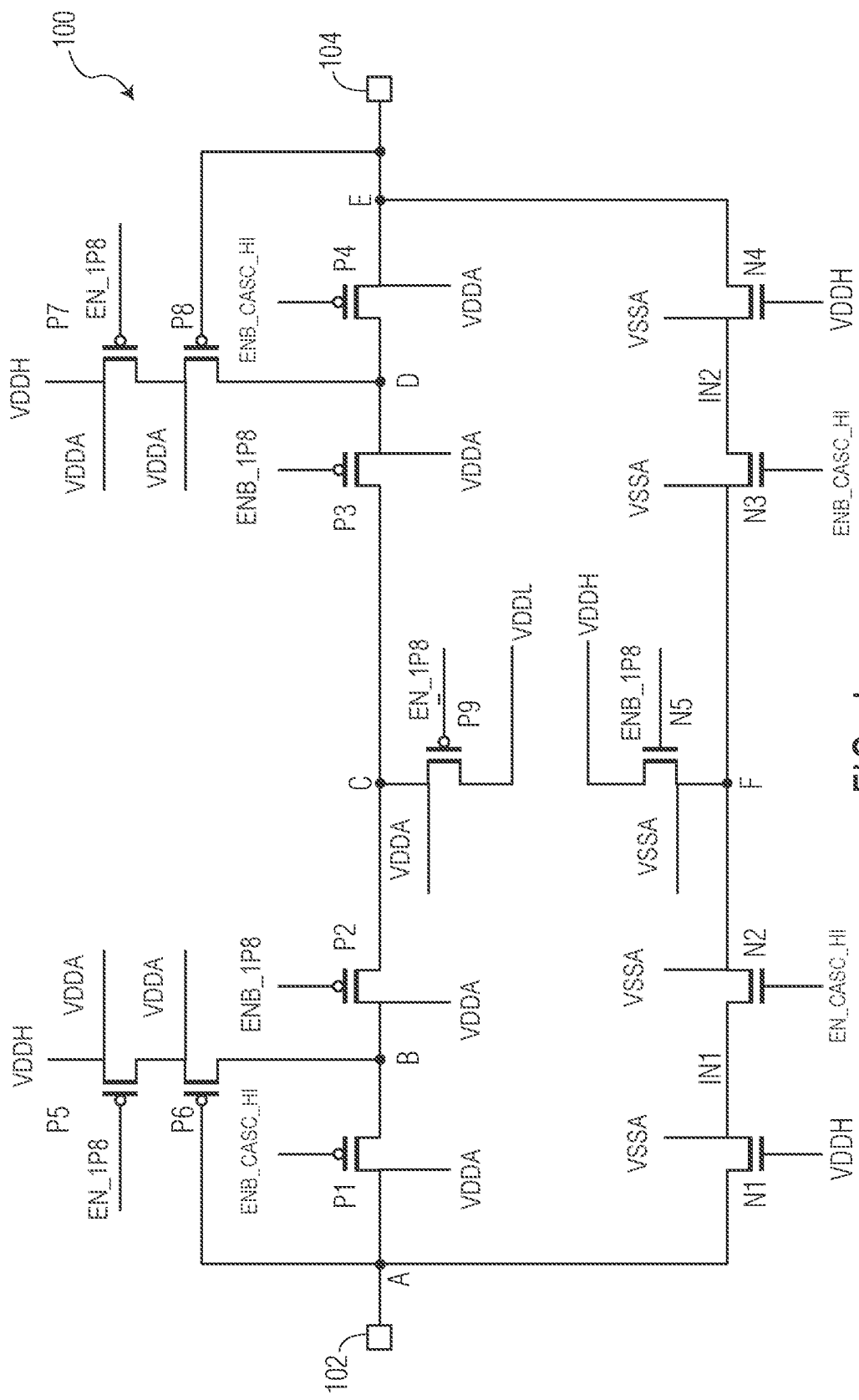
FIG. 1 illustrates a schematic diagram of an integrated circuit device in accordance with selected embodiments of the present invention.

FIG. 1 illustrates a schematic diagram of an integrated circuit device 100 in accordance with selected embodiments of the present invention that includes Input/Output pads 102, 104, PMOS transistors P1 through P9, and NMOS transistors N1 through N5. In the example shown, PMOS transistors P1 through P4 are compatible with 1.5V, and voltages at I/O pads 102, 104 may be 1.8V or more. Other suitable voltage levels may be used, however.

I/O pad 102 is coupled to node A and I/O pad 104 is coupled to node E. I/O pads 102, 104 can further be coupled to general purpose I/O circuitry (not shown) that provides an interface or connection between an external device (not shown) and IC device 100. PMOS transistor P1 includes a first current electrode coupled to node A, a second current electrode coupled to node B, a gate electrode coupled to a complement of an enable cascode high signal (ENB_CASC_HI), and a body tie coupled to supply voltage VDDA. PMOS transistor P2 includes a first current electrode coupled to node B, a second current electrode coupled to node C, a gate electrode coupled to a complement of an enable 1.8 signal (ENB_1P8), and a body tie coupled to supply voltage VDDA. PMOS transistor P3 includes a first current electrode coupled to node C, a second current electrode coupled to node D, a gate electrode coupled to the complement of the enable 1.8 signal (ENB_1P8), and a body tie coupled to supply voltage VDDA. PMOS transistor P4 includes a first current electrode coupled to node D, a second current electrode coupled to node E, a gate electrode coupled to the complement of the enable cascode high signal (ENB_CASC_HI), and a body tie coupled to supply voltage VDDA.

PMOS transistor P5 includes a first current electrode coupled to high supply voltage VDDH, a second current electrode coupled to a first current electrode of PMOS transistor P6, a gate electrode coupled to the enable 1.8 signal (EN_1P8), and a body tie coupled to supply voltage VDDA. PMOS transistor P6 includes a first current electrode coupled to the second current electrode of PMOS transistor P5, a second current electrode coupled to node B, a gate electrode coupled to node A, and a body tie coupled to supply voltage VDDA.

PMOS transistor P7 includes a first current electrode coupled to high supply voltage VDDH, a second current electrode coupled to a first current electrode of PMOS transistor P8, a gate electrode coupled to the enable 1.8 signal (EN_1P8), and a body tie coupled to supply voltage VDDA. PMOS transistor P8 includes a first current electrode coupled to the second current electrode of PMOS transistor P7, a second current electrode coupled to node D, a gate electrode coupled to node E, and a body tie coupled to supply voltage VDDA.

PMOS transistor P9 includes a first current electrode coupled to node C, a second current electrode coupled to low supply voltage VDDL, a gate electrode coupled to the enable 1.8 signal (EN_1P8), and a body tie coupled to supply voltage VDDA. In one embodiment, supply voltage VDDA is greater than supply voltage VDDH (which may also be referred to as a cascode high supply voltage), and supply voltage VDDH is greater than supply voltage VDDL (which may also be referred to as a cascode low supply voltage). In one embodiment, each of EN_1P8 and ENB_1P8 is configured to switch between 0V and VDDA, while each of EN_CASC_HI and ENB_CASC_HI is configured to switch between 0V and VDDH.

NMOS transistor N1 includes a first current electrode coupled to node A, a second current electrode coupled to a first current electrode of NMOS transistor N2, a gate electrode coupled to high supply voltage VDDH, and a body tie coupled to a low supply voltage VSSA, in which VDDL is greater than VSSA. NMOS transistor N2 includes a first current electrode coupled to the first current electrode of NMOS transistor N1, a second current electrode coupled to node F, a gate electrode coupled to an enable cascode high signal (EN_CASC_HI), and a body tie coupled to supply voltage VSSA. NMOS transistor N3 includes a first current electrode coupled to node F, a second current electrode coupled to the second current electrode of NMOS transistor N2, a gate electrode coupled to the enable cascode high signal (EN_CASC_HI), and a body tie coupled to supply voltage VSSA. NMOS transistor N4 includes a first current electrode coupled to the second current electrode of NMOS transistor N3, a second current electrode coupled to node E, a gate electrode coupled to high supply voltage VDDH, and a body tie coupled to supply voltage VSSA.

NMOS transistor N5 includes a first current electrode coupled to node F, a second current electrode coupled to high supply voltage VDDH, a gate electrode coupled to the complement of the enable 1.8 signal (ENB_1P8), and a body tie coupled to supply voltage VSSA.

During operation, devices that are attached to general purpose I/O pads 102, 104 may overshoot or undershoot the expected voltage levels due to current injection by inductors or wirebonds coupling external circuitry to I/O pads 102, 104. To protect against the over/under voltage conditions and current injection, protection circuitry, including transistors P1, P4, and P5-P9, may be operated in such a way to prevent voltages that are too high or too low from damaging transistors P2 and P3, and prevent over/under voltage at pad 104 from interfering with input voltage at pad 102 and vice versa, as further explained in the description of transmission gate circuits 400 and 500 in respective FIGS. 4 and 5.

Figure 2:
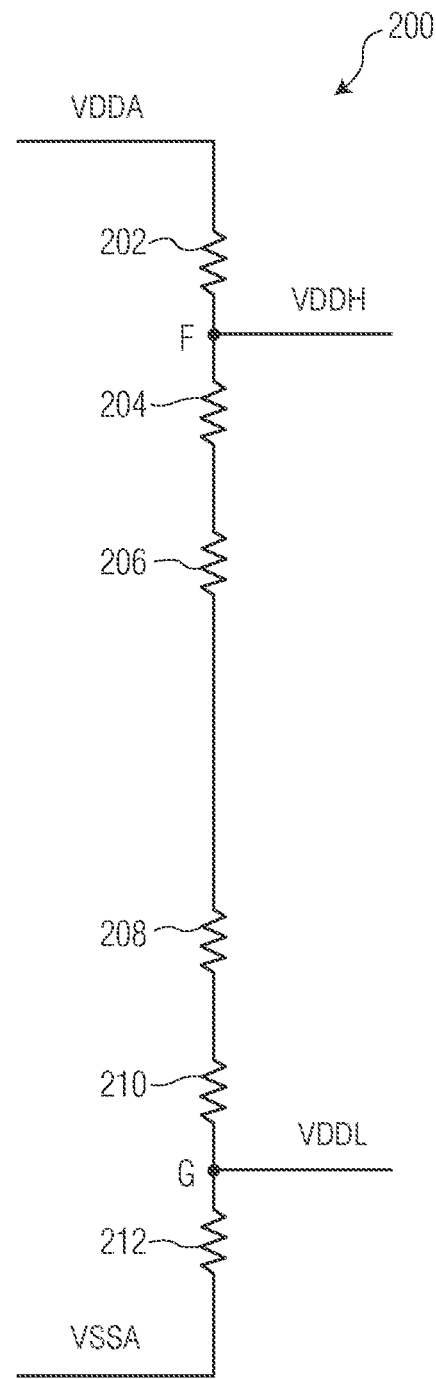
FIG. 2 illustrates a schematic diagram of a voltage divider that can generate voltages used in the integrated circuit device of FIG. 1.
Figure 3:
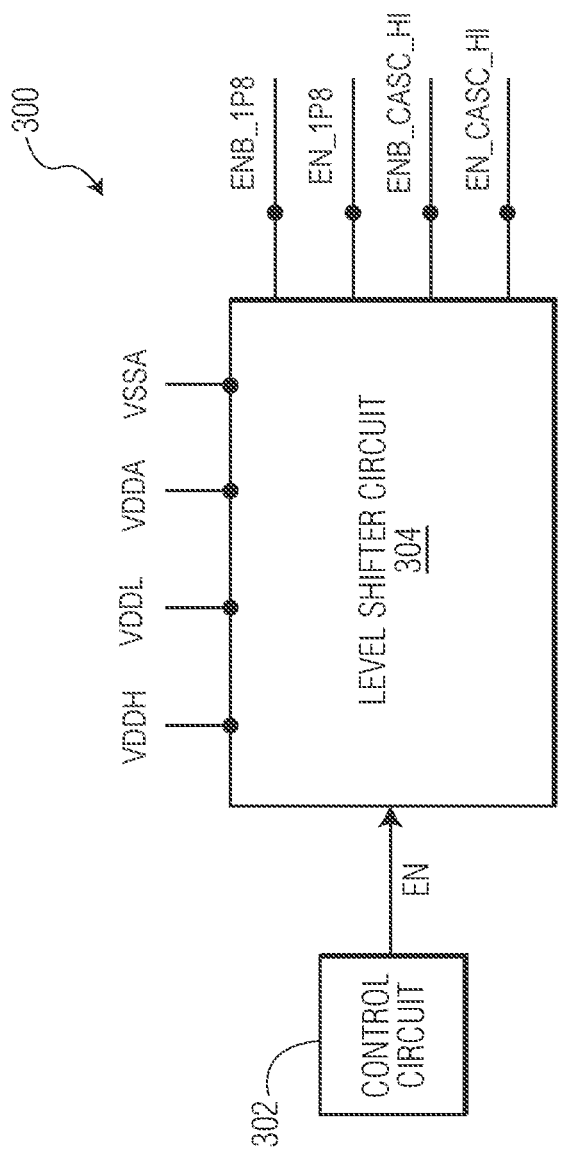
FIG. 3 illustrates a block diagram of a level shifter that can be used to generate signals and voltages used in the integrated circuit device of FIG. 1.

FIGS. 2 and 3 show circuits 200, 300 that can be used to generate voltages and signals that are used in IC device 100 of FIG. 1. FIG. 2 illustrates a schematic diagram of voltage divider 200 that can generate voltages VDDH and VDDL used in IC device 100 of FIG. 1. Voltage divider 200 includes a first terminal coupled to supply voltage VDDA and a second terminal coupled to supply voltage VSSA. Supply voltage VDDA may be set to 1.8V and supply voltage VSSA may be set to 0V. Other suitable voltage can be used for VDDA and VSSA, however. Resistive elements 202, 204, 206, 208, 210, 212 are coupled in series between the first and second supply voltage terminals VDDA and VSSA. A first terminal of resistive element 202 is coupled to supply voltage VDDA and a second terminal of resistive element 212 is coupled to supply voltage VSSA. In this manner, VDDA>VDDH>VDDL>VSSA. In the illustrated embodiment, cascode high voltage VDDH is five-sixths (⅚) of supply voltage VDDA (e.g. VDDH=1.5V), being taken at node F between a second terminal of resistive element 202 and a first terminal of resistive element 204. Cascode low voltage VDDL is one-sixth (⅙) of supply voltage VDDA (e.g. VDDL=0.3V), being taken at node G between a second terminal of resistive element 210 and a first terminal of resistive element 212. In the example shown, resistive elements 202-212 can have the same resistance, however, in other embodiments, some of resistive elements 202-212 may have different values, depending on the voltage levels desired for cascode high voltage VDDH and cascode low voltage VDDL. Alternatively, additional or fewer resistive elements 202-212 can be included in voltage divider 200, again depending on the voltage levels desired for cascode high voltage VDDH and cascode low voltage VDDL.

Referring to FIGS. 1 and 3, FIG. 3 illustrates a block diagram of signal generating circuitry 300 including control circuit 302 coupled to level shifter circuit 304 that provides signals used in IC device 100 of FIG. 1, including enable 1.8 signal EN_1P8 and its complement ENB_1P8, and enable high cascode voltage signal EN_CASC_HI and its complement EN_B_CASC_HI. Control circuit 302 generates an enable signal EN that is provided to level shifter circuit 304 to indicate whether or not the transmission gate is enabled or disabled for IC device 100. For example, when IC device 100 is used with termination resistors for a low voltage differential signal receiver, the input to level shifter 300 is HIGH, but when IC device 100 is used in a multiplexer circuit for an analog to digital converter and the channel is off, the protection circuitry is needed, and the input to level shifter 300 is set LOW. Additional inputs to level shifter circuit 304 include supply voltages VDDA, VSSA, VDDH, and VDDL.

In the example shown, when the passgate (e.g. transmission gate) is enabled, signal EN_1P8 is 1.8V, signal ENB_1P8 is 0V, signal EN_CASC_HI is 1.5V, and signal ENB_CASC_HI is 0V. When the passgate is disabled, protection circuitry is enabled, signal EN_1P8 is 0V, signal ENB_1P8 is 1.8V, signal EN_CASC_HI is 0V, and signal ENB_CASC_HI is 1.5V. Other suitable voltages can be used, however.

Figure 4:
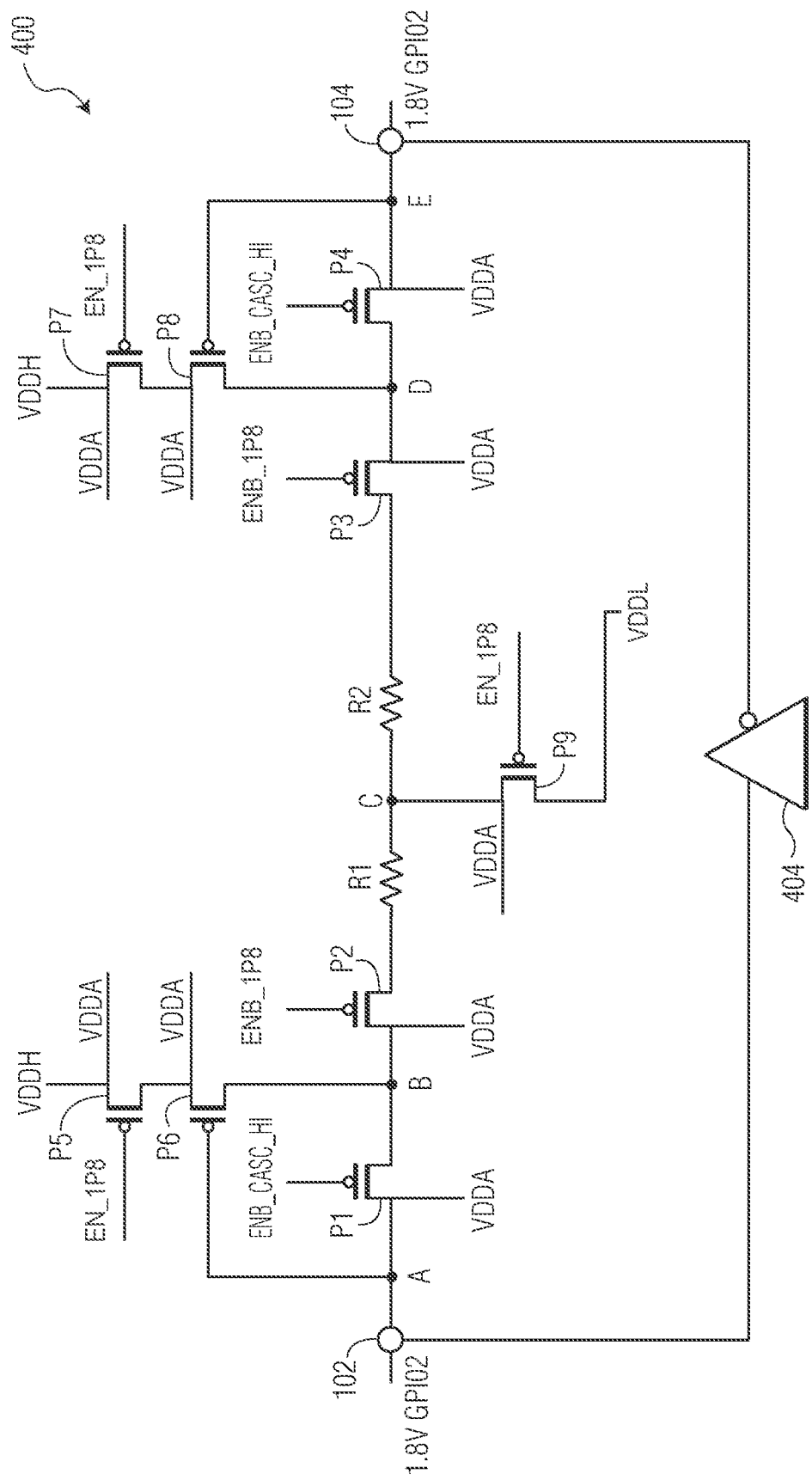
FIG. 4 illustrates a schematic diagram of another integrated circuit device in accordance with selected embodiments of the present invention.

An example of use of IC device 100 in a disabled mode is shown in FIG. 4, which shows IC device 400, also referred to as termination circuit 400, that includes termination resistors R1 and R2 for low voltage differential signalling (LVDS) driver 404. IC device 400 includes transistors P1-P9 of IC device 100 (FIG. 1) with the addition of termination resistors R1 and R2 and LVDS driver 404. Note that NMOS transistors N1-N5 shown in FIG. 1 are not shown in FIG. 4, but can be included.

Pads 102, 104 are coupled to respective non-inverting and inverting output terminals of LVDS driver circuit 404. Resistor R1 is coupled between a drain electrode of transistor P2 and node C, and resistor R2 is coupled between a drain electrode of transistor P3 and node C.

When the termination circuit is enabled, and the LVDS driver generates compliant differential voltage between inputs at pads 102 and 104, signal EN_1P8 may be set to 1.8V and signal EN_CASC_HI may be set to 1.5V. The respective complementary signals ENB_1P8 and ENB_CASC_HI are set to 0V. Transistors P1-P4 are in conductive mode and transistors P5-P9 are shut off. When the termination is disabled, Transistors P1-P4 are active, allowing pads 102 and 104 to be driven with the full range 0-1.8V.

Figure 5:
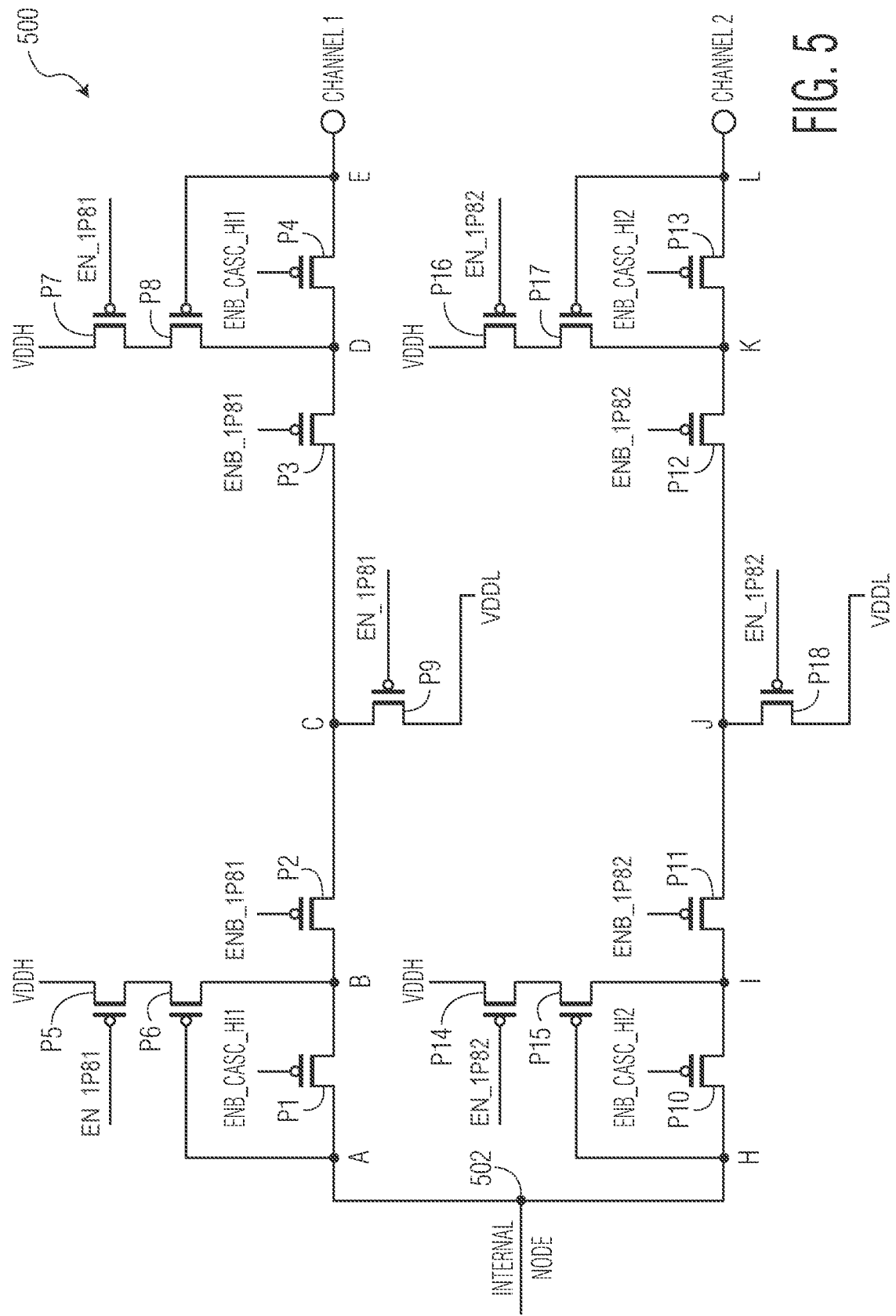
FIG. 5 illustrates a schematic diagram of another integrated circuit device in accordance with selected embodiments of the present invention.

As an example of use of IC device 100 in enabled mode, FIG. 5 shows IC device 500, also referred to as analog mux or mux circuit 500, that can be used in a multiplexer (mux) that is controlled to provide a selected channel of input to an analog to digital converter coupled to internal node 502. IC device 500 may include any number of input pads, such as pad 102, in which the mux can be implemented having a plurality of inputs coupled to a corresponding input pad of IC device 500, in which the mux communicates a signal between a selected input pad and an output at an internal signal node 502 of IC device 500. Each input path of the mux can therefore be implemented with circuitry similar to the circuitry described in reference to FIG. 1 between nodes A and E.

In the example shown, channel 1 is provided at pad 102, in which the channel 1 input path of the mux includes P1-P9 between nodes A and E, and channel 2 is provided at another pad of IC device 500, in which the channel 2 input path of the mux includes P10-P18 between nodes H and L, analogous to P1-P9, respectively. Additional channels can be included. Protection circuitry, including transistors P1 and P4-P9 for channel 1, and transistors P10 and P13-18 for channel 2, may be used to prevent damage to transistors P2, P3, P11, P12 from current injection at nodes B/I or D/K, and to reduce input voltage at the corresponding input pad that is above the voltage transistors P2, P3, P11, P12 are designed to handle to a lower voltage that is compatible with transistors P2, P3, P11 and P12.

The channel 1 circuit includes transistors P1-P9 of IC device 100 (FIG. 1) with node A coupled to internal node 502, corresponding to the output of the mux. Therefore, in the embodiment of FIG. 5, pad 104 (of FIG. 1) instead corresponds to an internal node rather than an external pad of the device. Note that NMOS transistors N1-N5 shown in FIG. 1 are not shown in FIG. 5, but can be included with the channel 1 circuit, and additional NMOS transistors (not shown) can be included with the channel 2 circuit. Similarly, the body ties to VDDA of each of the PMOS transistors of the channel 1 circuit (P1-P9) and of the channel 2 circuit (P10-P18) are not illustrated, but can be included as described above in reference to P1-P9 of FIG. 1. Similarly, the NMOS transistors, if present, can also include body ties to VSSA. The control signals for channel 1 are shown as ENB_CASC_HI1, ENB_1P81, and EN_1P81.

The channel 2 circuit includes PMOS transistors P10-P18. The control signals for channel 2 are shown as ENB_CASC_HI2, ENB_1P82, and EN_1P82. PMOS transistor P10 includes a first current electrode coupled to internal node 502 at node H, a second current electrode coupled to node I, and a gate electrode coupled to a complement of an enable cascode high signal (ENB_CASC_HI2). PMOS transistor P11 includes a first current electrode coupled to node I, a second current electrode coupled to node J, and a gate electrode coupled to a complement of an enable 1.8 signal (ENB_1P82). PMOS transistor P12 includes a first current electrode coupled to node J, a second current electrode coupled to node K, and a gate electrode coupled to the complement of the enable 1.8 signal (ENB_1P82). PMOS transistor P13 includes a first current electrode coupled to node K, a second current electrode coupled to node L, and a gate electrode coupled to the complement of the enable cascode high signal (ENB_CASC_HI2).

PMOS transistor P14 includes a first current electrode coupled to high supply voltage VDDH, a second current electrode coupled to a first current electrode of PMOS transistor P15, and a gate electrode coupled to the enable 1.8 signal (EN_1P82). PMOS transistor P15 includes a first current electrode coupled to the second current electrode of PMOS transistor P14, a second current electrode coupled to node I, and a gate electrode coupled to node H.

PMOS transistor P16 includes a first current electrode coupled to high supply voltage VDDH, a second current electrode coupled to a first current electrode of PMOS transistor P17, and a gate electrode coupled to the enable 1.8 signal (EN_1P82). PMOS transistor P17 includes a first current electrode coupled to the second current electrode of PMOS transistor P16, a second current electrode coupled to node K, and a gate electrode coupled to node L.

PMOS transistor P18 includes a first current electrode coupled to node J, a second current electrode coupled to low supply voltage VDDL, and a gate electrode coupled to the enable 1.8 signal (EN_1P82).

During operation in a disable mode of transmission gate circuitry 500 for channels of a multiplexer, the enable 1.8 signal (EN_1P8x) is deasserted (active high), the complement of enable 1.8 signals (ENB_1P8x) is set to 1.8V, and the complement of the enable cascode high signals (ENB_CASC_HIx) is set at 1.5V. Using channel 1 as an example, if the voltage at pad 102 is at or above 1.8V, transistor P8 is OFF, transistor P4 is ON because the source voltage (>1.8V) is higher than the gate voltage (1.5V) of transistor P4. The voltage at nodes node D is 1.8V. The voltage at node D is blocked from pass through by off transistor P3, which has both gate and source voltage at 1.8V. The voltage at node C is set by transistor P9 to VDDL (as EN_1P81 is low). Transistors P1-P4 are protected because the gate-source and drain-source voltages are less than 1.5V, which is compatible with the voltage limits of transistors P1-P4. The channel 2 circuitry operates in a similar manner.

In other circumstances, the voltage at pad 102 may be 0V, which may leave the voltage at node D undefined. However, with the voltage at pad 102 at 0V, transistor P8 is ON, which allows transistor P7 to pull the voltage at node D up to 1.5V (VDDH). With node D at 1.5V, the gate-source voltage of transistor P3 is prevented from going above 1.5V. Transistors P1-P4 are again protected when there is no input at pad 102 because the gate-source and drain-source voltages are less than 1.5V, which is compatible with the voltage limits of transistors P1-P4. The channel 2 circuitry operates in a similar manner.

Transistors P9 and P18 can offer additional protection to transistors P2, P3, P11 and P12 in their respective channels. Signal enable 1.8 (EN_1P8x) is set to zero, so transistors P9 and P18 are in conductive mode. If the corresponding input pad goes above 1.8V, node C in channel 1 or node J in channel 2 could go above 1.8V, transistor P9 or P18 would pull nodes C/J down to VDDL level and prevent pass through of voltage above 1.8 to internal node 502 and/or to channel 2. VDDL is set to a low voltage, for example, 0.3V, which would pull the voltage at node C (and node J) down to 0.3V. This helps ensure the gate-drain voltage of transistors P2 and P3 (or P11 and P12) does not exceed their rated voltage of 1.5V.

By now it should be appreciated that in selected embodiments, there has been provided an integrated circuit that may include a first transistor of a first conductivity type having a first current electrode coupled to a first internal node, a second current electrode coupled to a second internal node, and a control electrode coupled to receive a first control signal (ENB_1P8) configured to switch between a first supply voltage (e.g. VDDA) and a second supply voltage (e.g. VSSA). A second transistor of the first conductivity type may have a first current electrode coupled to the second internal node, a second current electrode coupled to a first signal node and a control electrode coupled to receive a second control signal (e.g. ENB_CASC_HI) configured to switch between a third supply voltage (e.g. VDDH) and the second supply voltage. The first supply voltage may be greater than the third supply voltage which may be greater than the second supply voltage. A third transistor of the first conductivity type may have a first current electrode coupled to the second internal node, a second current electrode coupled to a voltage supply terminal configured to provide the third supply voltage, and a control electrode coupled to the first signal node. During an enabled state, the first control signal and the second control signal are set so as to turn on the first and second transistors to communicate signals between the first internal node and the first signal node, and during a disabled state, the first control signal and the second control signal are set so as to turn off the first and second transistors.

In another aspect, the integrated circuit may further include a fourth transistor of the first conductivity type having a first current electrode coupled to the voltage supply terminal, a second current electrode coupled to the second current electrode of the third transistor such that the fourth and third transistors are coupled in series between the voltage supply terminal and the second internal node, and a control electrode coupled to receive a third control signal (e.g. EN_1P8), wherein the third control signal is an inverse of the first control signal.

In another aspect, the integrated circuit may further include a fifth transistor of the first conductivity type having a first current electrode coupled to a third internal node, a second current electrode coupled to the first internal node, and a control electrode coupled to receive the first control signal, a sixth transistor of the first conductivity type having a first current electrode coupled to a second signal node, a second current electrode coupled to the third internal node, and a control electrode coupled to receive the second control signal, a seventh transistor of the first conductivity type having a first current electrode coupled to the third internal node, a second current electrode coupled to the voltage supply terminal, and a control electrode coupled to the second signal node. During the enabled state, the first and second control signals may be set so as to turn on the first, second, fifth, and sixth transistors to communicate signals between the first signal node and the second signal node, and during the disabled state, the first and second control signals may be set so as to turn off the first, second, fifth, and sixth transistors.

In another aspect, the integrated circuit may further include an eighth transistor of the first conductivity type having a first current electrode coupled to the voltage supply terminal, a second current electrode coupled to the second current electrode of the seventh transistor, such that the seventh and eighth transistors are coupled in series between the voltage supply terminal and the third internal node.

In another aspect, the first signal node may be further characterized as a pad signal at a pad of the integrated circuit.

In another aspect, the second signal node may be further characterized as an internal signal node of the integrated circuit.

In another aspect, the integrated circuit may further include a multiplexer having a plurality of inputs coupled to a plurality of signal nodes, including the first signal node, and an output, wherein the multiplexer communicates a signal between a selected signal node of the plurality of signal nodes and the output, wherein the internal signal node is the output of the multiplexer.

In another aspect, the second signal node may be further characterized as a pad signal at a second pad of the integrated circuit.

In another aspect, the integrated circuit may further include a first resistive element coupled between the first internal node and a first current electrode of the first transistor; and a second resistive element coupled between the second current electrode of the fifth transistor and the first internal node.

In another aspect, the first signal node and the second signal node correspond to pad nodes of a low voltage differential signal (LVDS) interface.

In another aspect, the integrated circuit may further comprise a ninth transistor (P9) of the first conductivity type, having a first current electrode coupled to the first internal node, a second current electrode coupled to a second voltage supply terminal, and a control electrode coupled to receive the first control signal, wherein the second voltage supply terminal is configured to provide a fourth supply voltage (e.g. VDDL), wherein the third supply voltage is greater than the fourth supply voltage which is greater than the second supply voltage.

In another aspect, the integrated circuit may further comprise a first transistor of a second conductivity type, opposite the first conductivity type, having a first current electrode coupled to a third internal node, a second current electrode coupled to a fourth internal node and a control electrode coupled to receive a third control signal (e.g. EN_CASC_HI) configured to switch between the third supply voltage and the second supply voltage, wherein the third control signal is an inverse of the second control signal, and a second transistor of the first conductivity type having a first current electrode coupled to the fourth internal node, a second current electrode coupled to a first signal node and a control electrode coupled to the voltage supply terminal.

In another aspect, each of the first, second, and third transistors may be rated for a maximum voltage level of the third supply voltage.

In other selected embodiments, a transmission gate is implemented on an integrated circuit, the transmission gate may include a first p-type transistor having a first current electrode coupled to a first internal node, a second current electrode coupled to a second internal node and a control electrode coupled to receive a first control signal (e.g. ENB_1P8) configured to switch between a first supply voltage (e.g. VDDA) and a second supply voltage (e.g. VSSA); a second p-type transistor having a first current electrode coupled to the second internal node, a second current electrode coupled to a first signal pad of the integrated circuit and a control electrode coupled to receive a second control signal (e.g. ENB_CASC_HI) configured to switch between a third supply voltage and the second supply voltage, wherein the first supply voltage is greater than the third supply voltage which is greater than the second supply voltage, and a third p-type transistor having a first current electrode coupled to the second internal node, a second current electrode coupled to a voltage supply terminal configured to provide the third supply voltage, and a control electrode coupled to the first signal node. During an enabled state of the transmission gate, the first control signal and the second control signal are set so as to turn on the first and second transistors to communicate signals between the first internal node and the first pad signal, and during a disabled state of the transmission gate, the first control signal and the second control signal are set so as to turn off the first and second transistors.

In another aspect, the transmission gate may further include a fourth p-type transistor having a first current electrode coupled to the voltage supply terminal, a second current electrode coupled to the second current electrode of the third transistor such that the fourth and third transistors are coupled in series between the voltage supply terminal and the second internal node, and a control electrode coupled to receive a third control signal (e.g. EN_1P8), wherein the third control signal is an inverse of the first control signal.

In another aspect, the transmission gate may further include a fifth p-type transistor having a first current electrode coupled to the first internal node, a second current electrode coupled to a second voltage supply terminal, and a control electrode coupled to receive the first control signal. The second voltage supply terminal is configured to provide a fourth supply voltage, wherein the third supply voltage is greater than the fourth supply voltage which is greater than the second supply voltage.

In another aspect, each of the first, second, third, and fourth transistors are rated for a maximum voltage level of the third supply voltage.

In further selected embodiments, a method for operating a transmission gate having a first P-type transistor and a second P-type transistor coupled in series between a first signal node and an internal node may include enabling the transmission gate by turning on the first P-type transistor and the second P-type transistor to communicate signals between the first signal node and the internal node; and disabling the transmission gate by turning off the first P-type transistor and the second P-type transistor to stop communicating signals between the first signal node and the internal node, wherein while the transmission gate is disabled, using a third P-type transistor having a first current electrode coupled to a circuit node between the first and second P-type transistors and a control electrode coupled to the first signal node to track voltage of the first signal node and, in response to the tracking, control a voltage level at the circuit node so as to limit a gate-to-source voltage of the first P-type transistor.

In another aspect, the first P-type transistor has a first current electrode coupled to a first current electrode of the second P-type transistor at the circuit node and has a second current electrode coupled to the internal node, wherein enabling and disabling the transmission gate may include providing a first control signal to a control electrode of the first P-type transistor which switches between a first supply voltage and a second supply voltage, the first supply voltage being greater than the second supply voltage, wherein each of the first and second P-type transistors has a maximum voltage rating of less than the first supply voltage.

In another aspect, the disabling the transmission gate by turning off the first P-type transistor and the second P-type transistor may include setting the first control signal to the first supply voltage.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, although specific voltage levels are used in the examples, other suitable voltages can be used. In addition, although IC device 100 has been described as being used in circuitry for LVDS receivers and in a multiplexer, IC device 100 can be used in various other applications where transmission gates are needed. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistive elements and inductors, and combinations and arrays of any and all of these types of devices and elements. Further, the present invention does not depend upon the types of die or chips being used nor the materials of which they are constructed provided that such materials withstand the encapsulation process.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name, a lower or upper case "b" in or following the signal name, or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
a first transistor of a first conductivity type having a first current electrode coupled to a first internal node, a second current electrode coupled to a second internal node, and a control electrode coupled to receive a first control signal configured to switch between a first supply voltage and a second supply voltage;
a second transistor of the first conductivity type having a first current electrode coupled to the second internal node, a second current electrode coupled to a first signal node and a control electrode coupled to receive a second control signal configured to switch between a third supply voltage and the second supply voltage, wherein the first supply voltage is greater than the third supply voltage which is greater than the second supply voltage; and
a third transistor of the first conductivity type having a first current electrode coupled to the second internal node, a second current electrode coupled to a voltage supply terminal configured to provide the third supply voltage, and a control electrode coupled to the first signal node, wherein during an enabled state, the first control signal and the second control signal are set so as to turn on the first and second transistors to communicate signals between the first internal node and the first signal node, and during a disabled state, the first control signal and the second control signal are set so as to turn off the first and second transistors.

2. The integrated circuit of claim 1, further comprising:
a fourth transistor of the first conductivity type having a first current electrode coupled to the voltage supply terminal, a second current electrode coupled to the second current electrode of the third transistor such that the fourth and third transistors are coupled in series between the voltage supply terminal and the second internal node, and a control electrode coupled to receive a third control signal, wherein the third control signal is an inverse of the first control signal.

3. The integrated circuit of claim 2, further comprising:
a fifth transistor of the first conductivity type having a first current electrode coupled to a third internal node, a second current electrode coupled to the first internal node; and a control electrode coupled to receive the first control signal;
a sixth transistor of the first conductivity type having a first current electrode coupled to a second signal node, a second current electrode coupled to the third internal node, and a control electrode coupled to receive the second control signal; and
a seventh transistor of the first conductivity type having a first current electrode coupled to the third internal node, a second current electrode coupled to the voltage supply terminal, and a control electrode coupled to the second signal node, wherein during the enabled state, the first and second control signals are set so as to turn on the first, second, fifth, and sixth transistors to communicate signals between the first signal node and the second signal node, and during the disabled state, the first and second control signals are set so as to turn off the first, second, fifth, and sixth transistors.

4. The integrated circuit of claim 3, further comprising:
an eighth transistor of the first conductivity type having a first current electrode coupled to the voltage supply terminal, a second current electrode coupled to the second current electrode of the seventh transistor, such that the seventh and eighth transistors are coupled in series between the voltage supply terminal and the third internal node.

5. The integrated circuit of claim 4, wherein the first signal node receives a pad signal at a pad of the integrated circuit.

6. The integrated circuit of claim 5, wherein the second signal node is an internal signal node of the integrated circuit.

7. The integrated circuit of claim 6, further comprising:
a multiplexer having a plurality of inputs coupled to a plurality of signal nodes, including the first signal node, and an output, wherein the multiplexer communicates a signal between a selected signal node of the plurality of signal nodes and the output, wherein the internal signal node is the output of the multiplexer.

8. The integrated circuit of claim 5, wherein the second signal node receives a pad signal at a second pad of the integrated circuit.

9. The integrated circuit of claim 8, further comprising:
a first resistive element coupled between the first internal node and the first current electrode of the first transistor; and
a second resistive element coupled between the second current electrode of the fifth transistor and the first internal node.

10. The integrated circuit of claim 9, wherein the first signal node and the second signal node correspond to pad nodes of a low voltage differential signal (LVDS) interface.

11. The integrated circuit of claim 4, further comprising:
a ninth transistor of the first conductivity type, having a first current electrode coupled to the first internal node, a second current electrode coupled to a second voltage supply terminal, and a control electrode coupled to receive the first control signal, wherein the second voltage supply terminal is configured to provide a fourth supply voltage, wherein the third supply voltage is greater than the fourth supply voltage which is greater than the second supply voltage.

12. The integrated circuit of claim 1, further comprising:
a first transistor of a second conductivity type, opposite the first conductivity type, having a first current electrode coupled to a third internal node, a second current electrode coupled to a fourth internal node and a control electrode coupled to receive a third control signal configured to switch between the third supply voltage and the second supply voltage, wherein the third control signal is an inverse of the second control signal; and
a second transistor of the first conductivity type having a first current electrode coupled to the fourth internal node, a second current electrode coupled to a first signal node and a control electrode coupled to the voltage supply terminal.

13. The integrated circuit of claim 1, wherein each of the first, second, and third transistors are rated for a maximum voltage level of the third supply voltage.

14. A transmission gate implemented on an integrated circuit, the transmission gate comprising:
- a first p-type transistor having a first current electrode coupled to a first internal node, a second current electrode coupled to a second internal node and a control electrode coupled to receive a first control signal configured to switch between a first supply voltage and a second supply voltage;
- a second p-type transistor having a first current electrode coupled to the second internal node, a second current electrode coupled to a first signal pad of the integrated circuit and a control electrode coupled to receive a second control signal configured to switch between a third supply voltage and the second supply voltage, wherein the first supply voltage is greater than the third supply voltage which is greater than the second supply voltage; and
- a third p-type transistor having a first current electrode coupled to the second internal node, a second current electrode coupled to a voltage supply terminal configured to provide the third supply voltage, and a control electrode coupled to the first signal pad, wherein during an enabled state of the transmission gate, the first control signal and the second control signal are set so as to turn on the first and second transistors to communicate signals between the first internal node and the first signal pad, and during a disabled state of the transmission gate, the first control signal and the second control signal are set so as to turn off the first and second transistors.

15. The transmission gate of claim 14, further comprising:
- a fourth p-type transistor having a first current electrode coupled to the voltage supply terminal, a second current electrode coupled to the second current electrode of the third transistor such that the fourth and third transistors are coupled in series between the voltage supply terminal and the second internal node, and a control electrode coupled to receive a third control signal, wherein the third control signal is an inverse of the first control signal.

16. The transmission gate of claim 15, further comprising:
- a fifth p-type transistor having a first current electrode coupled to the first internal node, a second current electrode coupled to a second voltage supply terminal, and a control electrode coupled to receive the first control signal, wherein the second voltage supply terminal is configured to provide a fourth supply voltage, wherein the third supply voltage is greater than the fourth supply voltage which is greater than the second supply voltage.

17. The transmission gate of claim 15, wherein each of the first, second, third, and fourth transistors are rated for a maximum voltage level of the third supply voltage.

* * * * *